United States Patent
Kovesi et al.

(10) Patent No.: US 10,510,357 B2
(45) Date of Patent: Dec. 17, 2019

(54) RESAMPLING OF AN AUDIO SIGNAL BY INTERPOLATION FOR LOW-DELAY ENCODING/DECODING

(71) Applicant: Orange, Paris (FR)

(72) Inventors: Balazs Kovesi, Lannion (FR); Stephane Ragot, Lannion (FR)

(73) Assignee: ORANGE, Paris (FR)

( * ) Notice: Subject to any disclaimer, the term of this patent is extended or adjusted under 35 U.S.C. 154(b) by 245 days.

(21) Appl. No.: 15/322,312

(22) PCT Filed: Jun. 25, 2015

(86) PCT No.: PCT/FR2015/051725
§ 371 (c)(1),
(2) Date: Dec. 27, 2016

(87) PCT Pub. No.: WO2015/197989
PCT Pub. Date: Dec. 30, 2015

(65) Prior Publication Data
US 2017/0133027 A1    May 11, 2017

(30) Foreign Application Priority Data

Jun. 27, 2014 (FR) .................... 14 56077

(51) Int. Cl.
*G10L 19/24*    (2013.01)
*G10L 19/02*    (2013.01)
(Continued)

(52) U.S. Cl.
CPC .............. *G10L 19/24* (2013.01); *G06F 17/11* (2013.01); *G06F 17/17* (2013.01);
(Continued)

(58) Field of Classification Search
None
See application file for complete search history.

(56) References Cited

U.S. PATENT DOCUMENTS

| 2006/0088101 A1* | 4/2006 | Han ..................... H04N 19/51 |
| | | 375/240.16 |
| 2009/0083031 A1* | 3/2009 | Atlas .................... G10L 19/005 |
| | | 704/219 |

(Continued)

FOREIGN PATENT DOCUMENTS

WO    2012085451 A1    6/2012

OTHER PUBLICATIONS

Olli Niemitalo, Polynomial Interpolators for High-Quality Resampling of Oversampled Audio, Oct. 2001, pp. all URL: http://yehar.com/blog/wp-content/uploads/2009/08/deip.pdf (Year: 2001).*

(Continued)

*Primary Examiner* — Richa Mishra
(74) *Attorney, Agent, or Firm* — David D. Brush; Westman, Champlin & Koehler, P.A.

(57) ABSTRACT

A method is provided for resampling an audio-frequency signal in an audio-frequency signal encoding or decoding operation. The resampling is carried out by a method of interpolation of an order greater than one. The method is such that the interpolated samples are obtained by calculating a weighted average of possible interpolation values calculated over a plurality of intervals covering the time location of the sample to be interpolated. A resampling device is provided, which implements the method, and also an encoder and decoder including at least one resampling device.

12 Claims, 16 Drawing Sheets

(51) Int. Cl.
  *G10L 19/26* (2013.01)
  *G06F 17/11* (2006.01)
  *G06F 17/17* (2006.01)
  *G10L 21/00* (2013.01)
  *H03H 17/02* (2006.01)

(52) U.S. Cl.
  CPC .......... *G10L 19/0204* (2013.01); *G10L 19/26* (2013.01); *G10L 21/00* (2013.01); *H03H 17/028* (2013.01)

(56) References Cited

U.S. PATENT DOCUMENTS

2013/0289981 A1  10/2013  Ragot et al.
2015/0088528 A1* 3/2015  Toguri .................. G10L 19/005
                                                         704/500

OTHER PUBLICATIONS

International Search Report dated Aug. 20, 2015 for corresponding International Application No. PCT/FR2015/051725, filed Jun. 25, 2015.
Zolzer U. et al., "Interpolation Algorithms: Theory and Application", 97th Audio Engineering Society Convention Preprint, Nov. 1994, XP008077712.
Wise D. K. et al., "Performance of low-order polynomial interpolators in the presence of oversampled input" 107th Audio Engineering Society Convention, Sep. 1999, XP055192379.
Franck A., "Performance Evaluation of Algorithms for Arbitrary Sample Rate Conversion", 131st Audio Engineering Society Convention, Oct. 2011, XP040567626.
English translation of the International Written Opinion dated Aug. 20, 2015 for corresponding International Application No. PCT/FR2015/051725, filed Jun. 25, 2015.
R.W. Schafer, L.R. Rabiner, A Digital Signal Processing Approach to Interpolation, Proceedings of the IEEE, vol. 61, No. 6, Jun. 1973, pp. 692-702.
ISO/IEC "Information technology—MPEG audio technologies—Part 3: Unified speech and audio coding", Sep. 20, 2011.
3GPP TS 26.290 V14.0.0 (Mar. 17, 2017), "3rd Generation Partnership Project; Technical Specification Group Services and System Aspects; Audio codec processing functions; Extended Adaptive Multi-Rate-Wideband (AMR-WB+) codec; Transcoding functions (Release 14)".
3GPP TS 26.290 V11.0.0 (Sep. 21, 2012), "3rd Generation Partnership Project; Technical Specification Group Services and System Aspects; Audio codec processing functions; Extended Adaptive Multi-Rate-Wideband (AMR-WB+) codec; Transcoding functions (Release 11)".

\* cited by examiner

Fig. 1 (STATE OF THE ART)

Fig. 2 (STATE OF THE ART)

Fig. 3 (STATE OF THE ART)

Fig. 4 (STATE OF THE ART)

Fig. 5 (STATE OF THE ART)

Fig. 6 (STATE OF THE ART)

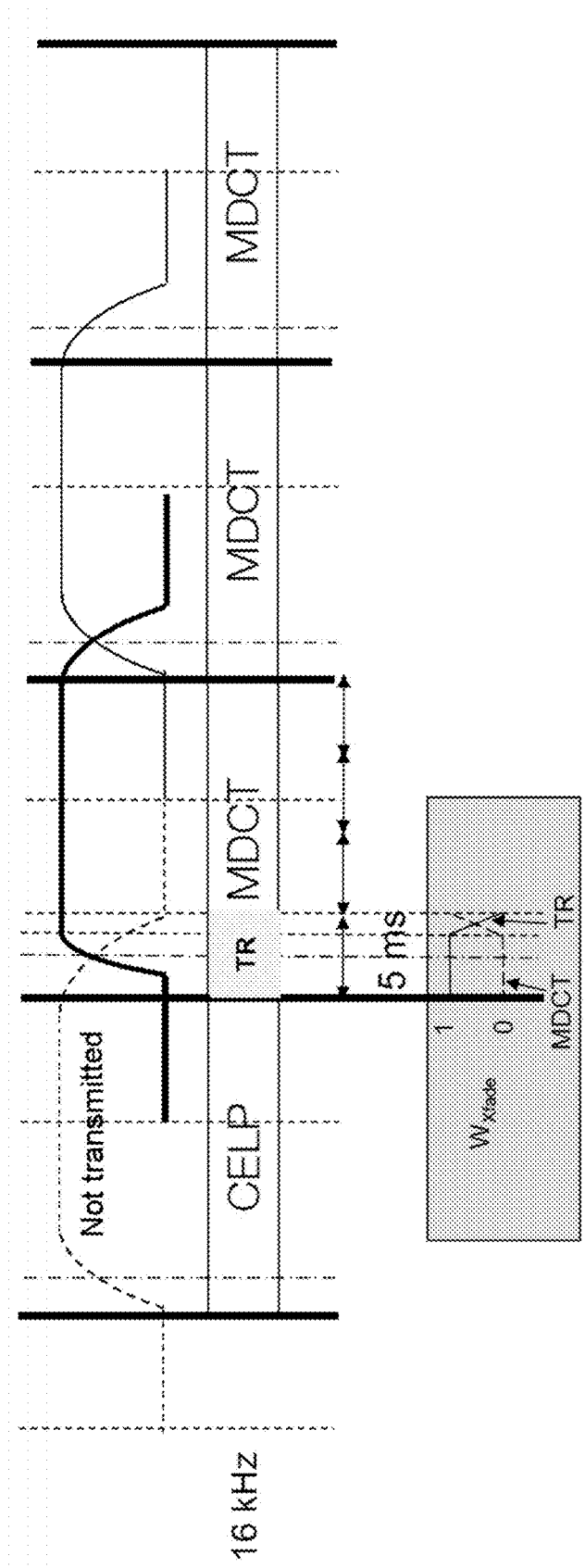
Fig.9a (STATE OF THE ART)

RESAMPLING OF AN AUDIO SIGNAL BY INTERPOLATION FOR LOW-DELAY ENCODING/DECODING

CROSS-REFERENCE TO RELATED APPLICATIONS

This Application is a Section 371 National Stage Application of International Application No. PCT/FR2015/051725, filed Jun. 25, 2015, the content of which is incorporated herein by reference in its entirety, and published as WO 2015/197989 on Dec. 30, 2015, not in English.

FIELD OF THE DISCLOSURE

The present invention relates to the processing of an audio frequency signal for the transmission or storage thereof. More particularly, the invention relates to changing of sampling frequency in a coding or a decoding of the audio frequency signal.

BACKGROUND OF THE DISCLOSURE

Many techniques exist for compressing (with loss) an audio frequency signal such as speech or music. The coding can be performed directly at the sampling frequency of the input signal, as for example in ITU-T recommendations G.711 or G.729 where the input signal is sampled at 8 kHz and the coder and decoder operate at this same frequency.

However, some coding methods use a change of sampling frequency, for example to reduce the complexity of the coding, adapt the coding according to the different frequency subbands to be coded, or convert the input signal so that it corresponds to a predefined internal sampling frequency of the coder.

In the subband coding defined in ITU-T recommendation G.722, the 16 kHz input signal is divided into two subbands (sampled at 8 kHz) which are coded separately by a coder of ADPCM (adaptive differential pulse code modulation) type. This division into two subbands is performed by a bank of quadratic mirror filters with finite impulse response (FIR), of order 23 which theoretically brings about an analysis-synthesis delay (coder+decoder) of 23 samples at 16 ms; this filter bank is employed with a polyphase implementation. The division into two subbands in G.722 makes it possible to allocate, in a predetermined manner, different bit rates to the two subbands according to their a priori perceptual importance and also to reduce the overall coding complexity by executing two coders of ADPCM type at a lower frequency. However, it induces an algorithmic delay compared to a direct ADPCM coding.

Various methods for changing sampling frequency, also called resampling, of a digital signal are known, by using, for example and in a nonexhaustive manner, an FIR (finite impulse response) filter, an IIR (infinite impulse response) filter or a polynomial interpolation (including the splines). A review of the conventional resampling methods can be found for example in the article by R. W. Schafer, L. R. Rabiner, A Digital Signal Processing Approach to Interpolation, Proceedings of the IEEE, vol. 61, No. 6, June 1973, pp. 692-702.

The advantage of the FIR (symmetrical) filter lies in its simplified implementation and—subject to certain conditions—to the possibility of ensuring a linear phase. A linear phase filtering makes it possible to preserve the waveform of the input signal, but it can be also be accompanied by a temporal spreading (ringing) that can create artifacts of pre-echo type on transients. This method brings about a delay (which is a function of the length of the impulse response), generally of the order of 1 to a few ms to ensure suitable filtering characteristics (in-band ripple, rejection level sufficient to eliminate the aliasing or spectral images, etc.).

Another alternative for resampling is to use a polynomial interpolation technique. The polynomial interpolation is above all effective for up-sampling or for down-sampling with frequencies that are close (for example from 16 kHz to 12.8 kHz).

For the cases of down-sampling with high ratio (for example from 32 kHz to 12.8 kHz), the polynomial interpolation is not the most suitable method because it does not eliminate the aliasings due to the high frequencies (in the example of down-sampling from 32 kHz to 12.8 kHz it concerns frequencies from 6.4 kHz to 16 kHz). The advantage of polynomial interpolation over the filtering techniques is the low delay, even a zero delay, and also the generally lower complexity. The use of interpolation is above all advantageous for the resampling of vectors of short length (of the order of 10 or so samples) such as, for example, a filter memory, as described later in an embodiment of the invention.

The best known and most widely used polynomial interpolation techniques are linear interpolation, parabolic interpolation, cubic interpolation in several variants, depending on the local or non-local nature of the interpolation and according to the possible constraints of continuity of the kth derivatives.

Here, the simple case of so-called Lagrange interpolation, where the parameters of a polynomial curve are identified from predefined points, is considered in more detail. It is assumed that this interpolation is repeated locally if the number of points to be interpolated is greater than the number of predefined points strictly necessary for the interpolation. In the prior art, more sophisticated techniques such as interpolation "splines" or B-splines corresponding to piecewise polynomials with constraints of continuity of the kth successive derivatives are well known; they are not reviewed here because the invention is differentiated therefrom.

FIG. 1 shows a comparison between the $1^{st}$ order linear interpolation (o1, dotted line), the $2^{nd}$ order parabolic interpolation (02, discontinuous line), the $3^{rd}$ order cubic interpolation (03, solid line) and the $4^{th}$ order interpolation (o4, chain-dotted line).

For the linear interpolation, two points determine a straight line for which the equation is $vl(x)=a1*x+b1$. In FIG. 1, the points at the instants x=0 and x=1, which delimit the interval [0, 1], were used. If the value of these points is v(0) and v(1) respectively, the coefficients a1 and b1 are obtained as follows:

$$a1=v(1)-v(0)$$

$$b1=v(0)$$

The coefficients a1 and b1 of a straight line are obtained using a single addition operation and the computation of an interpolated sample vl(x) costs an addition operation and a multiplication operation, or a multiplication-addition operation (MAC).

For the parabolic interpolation, three points determine a parabola for which the equation is $vp(x)=a2*x^2+b2*x+c2$. In FIG. 1, the points at the instants x=−1, x=0 and x=1, which delimit 2 intervals, [−1, 0] and [0, 1], were used. If the value of these points is v(−1), v(0) and v(1) respectively, the coefficients a2, b2 and c2 are obtained as follows:

$$a2=(v(-1)+v(1))/2-v(0)$$

$$b2=v(1)-v(0)-a2$$

$$c2=v(0)$$

Obtaining the coefficients a2, b2 and c2 of a parabola requires 4 addition operations and a multiplication operation or 3 addition operations and an MAC operation. The computation of an interpolated sample vp(x) costs 2 addition operations and 3 multiplication operations or one multiplication operation and 2 MAC operations.

For the cubic interpolation, four points determine a cubic curve for which the equation is $vc(x)=a3*x^3+b3*x^2+c3*x+d3$. In FIG. 1, the points at the instants x=−1, x=0, x=1 and x=2, which delimit 3 intervals, [−1, 0], [0, 1] and [1, 2], were used. If the value of these points is v(−1), v(0), v(1) and v(2) respectively, the coefficients a3, b3, c3 and d3 are obtained as follows:

$$b3=(v(-1)+v(1))/2-v(0)$$

$$a3=(v(-1)+v(2)-v(0)-v(1)-4*b3)/6$$

$$c3=v(1)-v(0)-b3-a3$$

$$d3=v(0)$$

Obtaining the coefficients a3, b3, c3 and d3 of a cube requires 9 addition operations and 3 multiplication operations or 7 addition operations, 2 MAC operations and one multiplication operation. The computation of an interpolated sample vc(x) costs 3 addition operations and 6 multiplication operations or, by optimizing, 2 multiplication operations and 3 MAC operations.

For the $4^{th}$ order interpolation, 5 points determine a $4^{th}$ order curve for which the equation is $v4(x)=a4*x^4+b4*x^3+c4*x^2+d4*x+e4$. In FIG. 1, the points at the instants x=−2, x=−1, x=0, x=1 and x=2 which delimit 4 intervals [−2, −1], [−1, 0], [0, 1] and [1, 2], were used. If the value of these points is v(−2), v(−1), v(0), v(1) and v(2) respectively, the coefficients a4, b4, c4, d4 and e4 are obtained as follows:

$$vt1=v(-2)+v(2)-2*v(0)$$

$$vt2=v(-1)+v(1)-2*v(0)$$

$$vt3=v(2)-v(-2)$$

$$vt4=v(1)-v(-1)$$

$$a4=(vt1-4*vt2)/24$$

$$b4=(vt3-2*vt4)/12$$

$$c4=(16*vt2-vt1)/24$$

$$d4=(8*vt4-vt3)/12$$

$$e4=v(0)$$

Obtaining the coefficients a4, b4, c4, d4 and e4 for a $4^{th}$ order curve requires 10 addition operations and 10 multiplication operations or 6 addition operations, 8 MAC operations and 2 multiplication operations. Computing an interpolated sample vc(x) costs 4 addition operations and 10 multiplication operations or, by optimizing, 3 multiplication operations and 4 MAC operations.

To compute the coefficients of a curve, for example the coefficients a3, b3, c3 and d3 of a cubic curve, without loss of generality, it is recommended to consider the 4 consecutive input samples as if they were samples of index x=−1, x=0, x=1 and x=2 to simplify the computations.

When a resampling of a signal is performed, there is a desire to know the value of the signal between 2 known points of the signal to be resampled, within the interval delimited by these 2 points. For example, for up-sampling of a factor 2, it is necessary to estimate the value of the signal for x=0.5. To do this estimation, one of the values vl(0.5), vp(0.5) or vc(0.5) is simply computed.

By using the linear interpolation, the straight line is used that links the 2 known neighboring points (x=0 and x=1 to compute x=0.5, x=1 and x=2 to compute x=1.5).

In case of $2^{nd}$ order interpolation, there is a choice between 2 possible parabolas because the 3 points determining the parabola delimit 2 intervals. For example, for x=0.5, it is possible to take the curve linking the points x=−1, x=0 and x=1 or the points x=0, x=1 and x=2. Experimentally, it is possible to check that the 2 solutions will be of the same quality. Advantageously, to reduce the complexity, it is possible to use a single parabola for 2 intervals; this simplification is used hereinbelow when the parabolic interpolation is discussed.

In case of $3^{rd}$ order interpolation, the cubic passes through 4 input samples which delimit 3 intervals, 2 intervals at the ends and one central interval. Generally and as in the results presented in FIG. 6, the central interval [0, 1] is used to perform the interpolation from the points at the instants x=−1, 0, 1 and 2.

In case of $4^{th}$ order interpolation, the curve passes through 5 input samples which delimit 4 intervals, 2 at the ends and two central ones. Experimentally, it can be shown that the use of one of the two central intervals gives the better result, and that the two central intervals give the same quality. As for the parabolic case, it is possible to proceed here also by groups of 2 input samples.

To compare the performance levels of these interpolations of the prior art, a series of sinusoids having a frequency of 200 to 6400 Hz and a pitch of 200 Hz was generated both at a sampling frequency of 12 800 Hz and of 32 000 Hz. Then, the sinusoids at 12 800 Hz were up sampled to 32 kHz and the signal-to-noise ratio (SNR) was measured for each sinusoid frequency and for each interpolation method (with delay compensation for the resampling by FIR). It is important to note here that the interpolation was implemented by shifting the instant x 0 to make it coincide with the current sampling at the input frequency; the interpolation is therefore done without delay. The samples at the edge of the input signal to be resampled, that is to say the first samples and the last samples, were disregarded. FIG. 2 summarizes the results obtained with the linear interpolation ("lin"), the parabolic or $2^{nd}$ order interpolation ("o2", by using 1 parabola for 2 intervals), the cubic or $3^{rd}$ order interpolation ("o3", by using the central interval), $4^{th}$ order interpolation ("o4", by using the 2 central intervals of a $4^{th}$ order curve for 2 intervals), cubic "spline" interpolation ("spline", by using the Matlab "spline" command) and resampling by FIR filtering ("FIR", by using the Matlab command "s32=resample(s12, 5, 2, 30)"). The results show that the FIR filtering gives the better quasi-constant SNR for all the frequencies up to 5500 Hz at the cost of higher complexity and a consequential algorithmic delay (compensated here by using the impulse response of the FIR filter as if it were a zero-phase filter). The different interpolations have good performance levels for the low frequencies but the SNR drops rapidly with the increase in frequency. The higher the interpolation order, the better the result, but this improvement is limited for the second half of the spectrum where the difference between the $3^{rd}$ order and $4^{th}$ order interpolations is insignificant and nonexistent for the last quarter of the spectrum. With the cubic interpolation, the SNR is less than 30 dB for the frequencies higher than 2500 Hz, this limit is 2800 Hz for the $4^{th}$ order interpolation. At the cost of higher complexity, it is the cubic "spline" interpolation which offers the best interpolation performance levels with 30 dB at 3500 Hz. Hereinafter, the FIR interpolation will be considered as reference. The SNR was also measured for a speech signal (relative to the reference signal obtained by FIR). The signal-to-noise ratios obtained are 34.7 dB with the linear interpolation, 35.5 dB with the parabolic interpolation, 38.2 dB with the cubic interpolation, 37.9 dB with the $4^{th}$ order interpolation and 41.4 dB with the cubic "spline" interpolation. It can therefore be concluded that the interpolation of order higher than 3 is of little interest, this increase in order cannot be measured for the real signals. Hereinbelow, the $4^{th}$ order interpolation case will not be considered.

FIG. 3 illustrates an interpolation from 12 800 Hz to 32 000 Hz on a real case. The squares represent the samples of the signal at 12 800 Hz, the triangles, the signal samples up sampled to 32 000 Hz by an FIR method which gives the reference signal which will be used as a basis hereinbelow. The dotted vertical lines give the sampling instants at 32 kHz. It will be observed that, in this example, for 2 input samples at 12.8 kHz, 5 output samples at 32 kHz are obtained, of which one is identical to one of the input samples (that still requires a copy operation). Two samples are interpolated per interval between the consecutive input samples at 12.8 kHz. It is thus possible to estimate, for 2 input samples, the computation complexity for the different interpolations, by assuming that the addition, multiplication or MAC operations all have the same weight (which is the case for most of the signal processing processors, or digital signal processors DSP):

linear interpolation: 2 straight lines, 4 interpolated samples and one copy: 7 operations, i.e. 44 800 operations per second.

Parabolic interpolation: 1 parabola, 4 interpolated samples and one copy: 17 operations, i.e. 108 800 operations per second.

Cubic interpolation: 2 cubics, 4 interpolated samples and one copy: 41 operations, i.e. 262 400 operations per second.

These complexities can be further reduced by tabulating the values $x^2$ and $x^3$, that is to say by pre-computing them and by storing them in a table. This is possible because the same temporal indices are always used, for example the interpolation is done within the interval [0, 1]. For example, in the cubic interpolation and in the example of up-sampling from 12 800 Hz to 32 000 Hz, these values must be tabulated only for x=0.2, 0.4, 0.6 and 0.8. This can save one or two multiplications per interpolated sample. Thus, for the parabolic interpolation, the complexity is reduced to 13 operations, i.e. 83 200 operations per second, and for the cubic interpolation it is reduced to 33 operations, i.e. 211 200 operations per second.

In FIG. 4, the FIG. 3 has been completed to illustrate the linear interpolation. The samples of the up sampled signal (round markers) are given by the intersections of the straight lines (illustrated by solid line and by dotted line) between 2 input samples (square markers) and of the output sampling moments (dotted vertical lines). Compared to the reference signal (triangular markers), several significant deviations can be observed. It will be noted that the different straight lines used are represented alternately by a solid line or by a dotted line. In a way similar to FIG. 4, FIG. 5 illustrates the parabolic interpolation with a parabola computed for 2 intervals. The greatest error is at the instant 281.5 µs. It will be noted that the different parabolas used are represented alternately by a solid line or by a dotted line.

FIG. 6 illustrates the cubic interpolation. The interpolated samples illustrated by the round markers were obtained with the central interval. Once again, several deviations relative to the reference signal are observed. It is assumed here that the input signal is known outside of the time domain represented in the figure, so that the samples at the edges (here, the two first and the two last input samples) can be used for the interpolation. It will be noted that the different cubics used are represented alternately by a solid line or by a dotted line; it will be recalled that only the central interval is used.

It can be seen that these interpolations can be perfected. It has been shown that the increase in the order of interpolation beyond 3 is not an advantageous solution. It is known from the prior art that the interpolation "splines" can generally achieve better performance levels but at the cost of much higher complexity.

There is therefore a need to develop a more efficient interpolation solution with reduced increase in complexity.

SUMMARY

The present invention improves on the situation from the prior art.

To this end, it proposes a method for resampling an audio frequency signal in an audio frequency decoding, the resampling being performed by an interpolation method of order higher than one. The method is such that the interpolated samples are obtained by a computation of a weighted average of possible interpolation values computed over a plurality of intervals covering the temporal location of the sample to be interpolated.

Thus, the average of the possible interpolation values obtained over several intervals makes it possible to obtain an interpolated sample value close to the real signal value. This weighted average computation operation is not costly in terms of complexity, which makes it possible to obtain a more efficient interpolation for a reduced increase in complexity.

The different particular embodiments mentioned hereinbelow can be added independently or in combination with one another to the resampling method described above.

In a particular embodiment, the interpolation is of $2^{nd}$ order parabolic type.

In this case, the interpolated samples are obtained by a computation of a weighted average of possible interpolation values computed over two intervals covering the temporal location of the sample to be interpolated.

This solution gives a result that is almost equivalent to the simple cubic interpolation but is less complex.

In one embodiment of the invention, the interpolation is of $3^{rd}$ order cubic type and the number of intervals covering the temporal location of the sample to be interpolated is 3.

This embodiment makes it possible to have an interpolation of good quality, the interpolated samples being closer to the reference signal than are the samples interpolated by simple cubic interpolation obtained only with the central interval. The quality is therefore improved for a comparable complexity.

In a particular embodiment, the weighted average is applied with one and the same weighting value for each of the possible interpolation values.

These weighting values make it possible to obtain a performance level that is still greater than the Lagrange polynomial interpolations, and notably a better signal-to-noise ratio.

In a variant embodiment, a different weighting value is applied for the interpolation value computed for the central interval of the three intervals and for the computation of the weighted average.

If one of the weights has a zero value, this variant reduces the complexity and improves the signal-to-noise ratio performance levels for the high frequencies. More generally, the performance levels can be improved for certain frequency zones depending on the weighting values chosen.

In another variant embodiment, the weighting values applied to the possible interpolation values are determined as a function of a frequency criterion of the sample to be interpolated.

This makes it possible to have better signal-to-noise ratio performance levels regardless of the frequency of the signal to be interpolated.

In a particularly suitable embodiment, the resampling is performed on a signal contained in a memory of a resampling filter of FIR type.

In effect, this resampling method is particularly suited to a signal vector of short length like filter memories.

In a particular context of embodiment, the interpolated samples complement a signal decoded according to a restricted predictive decoding mode in a transition frame between a predictive decoding and a transform decoding prior to a step of combination between the samples decoded according to the restricted predictive decoding and the samples decoded according to a transform decoding in the transition frame.

The resampling according to the invention is suited to this context of transition between two coding modes and when a delay due to the resampling can result in a lack of samples. The proposed interpolation is then effective and less complex for this type of signal of short length.

The present invention also targets a device for resampling an audio frequency signal in an audio frequency signal coder or decoder, the resampling being performed by an interpolation method of order higher than one. The device is such that it comprises:
 a module for computing possible interpolation values for a plurality of intervals covering the temporal location of a sample to be interpolated; and
 a module for obtaining the sample to be interpolated by computation of a weighted average of the possible interpolation values derived from the computation module.

This device offers the same advantages as the method described previously, which it implements.

The present invention also targets an audio frequency signal coder and decoder comprising at least one resampling device as described.

The invention targets a computer program comprising code instructions for implementing the steps of the resampling method as described, when these instructions are executed by a processor.

Finally, the invention relates to a, computer-readable, storage medium, incorporated or not in the resampling device, possibly removable, storing a computer program implementing a resampling method as described previously.

Other features and advantages of the invention will become more clearly apparent on reading the following description, given solely as a nonlimiting example, and with reference to the attached drawings.

BRIEF DESCRIPTION OF THE DRAWINGS

FIG. 9a illustrates a transition between a signal frame coded with a predictive coding and a frame coded by transform according to a prior art method;

DETAILED DESCRIPTION OF ILLUSTRATIVE EMBODIMENTS

Figure 7:
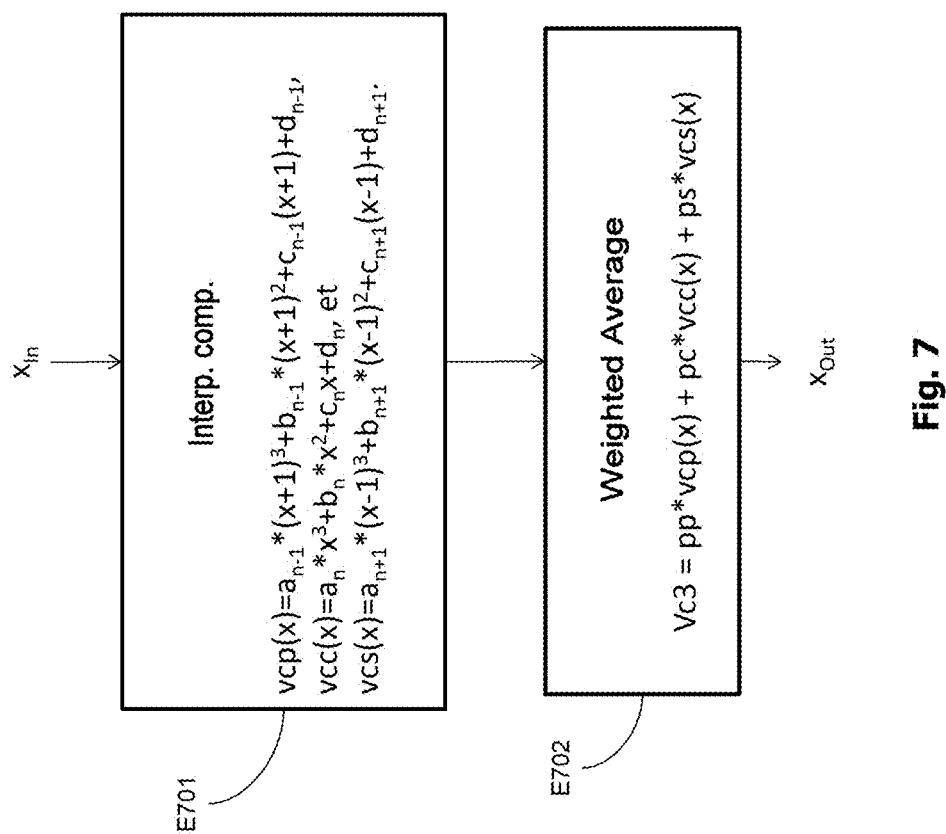
FIG. 7 illustrates, in flow diagram form, the steps of a resampling method according to an embodiment of the invention.

FIG. 7 therefore illustrates the main steps of a resampling method according to an embodiment of the invention.

The steps of this method are implemented with, as input ($x_{In}$), an audio frequency signal at the input sampling frequency $f_{In}$. This input signal can for example be the signal vectors of short length contained in a resampling filter memory as described later with reference to FIGS. 8 and 10.

In the embodiment described here, an interpolation method of $3^{rd}$ order cubic type is used. A different order of interpolation can of course be used, the order however being greater than one.

In the step E701, a cubic interpolation is used not only on the central interval but over the 3 intervals:
the interval on the right (interval [1, 2]) of the preceding cubic,
the central interval of the central cubic (interval [0, 1]) and
the interval on the left (interval [−1, 0]) of the next cubic to interpolate a value at a temporal instant x in [0, 1].

The three possible interpolation values are obtained. This increases the computation complexity in a limited way because the coefficients of a cubic are in any case computed per interval. If use is made of the simplified notation (without mentioning the $3^{rd}$ order) $a_n$, $b_n$, $c_n$, $d_n$ for the coefficients of the cubic of which the central interval is used, $a_{n-1}$, $b_{n-1}$, $c_{n-1}$, $d_{n-1}$ for the coefficients of the cubic in the preceding interval and $a_{n+1}$, $b_{n+1}$, $c_{n+1}$, $d_{n+1}$ for the coefficients of the cubic in the next interval, the three possible interpolation values are obtained by:

$$vcp(x)=a_{n-1}*(x+1)^3+b_{n-1}*(x+1)^2+c_{n-1}(x+1)+d_{n-1},$$

$$vcc(x)=a_n*x^3+b_n*x^2+c_nx+d_n, \text{ and}$$

$$vcs(x)=a_{n+1}*(x-1)^3+b_{n-1}*(x-1)^2+c_{n+1}(x-1)+d_{n+1}.$$

Once again, the values $(x+1)^3$, $(x+1)^2$, $x^3$, $x^2$, $(x-1)^3$ and $(x-1)^2$ can be tabulated to reduce the complexity.

Thus, the step E701 computes possible interpolation values over a plurality of intervals covering the temporal location of the sample to be interpolated (in the example given here, the interpolation order is 3).

In the step E702, a weighted average of the three possible interpolated values is computed to obtain the sample to be interpolated. The output signal resampled at the output frequency $f_{Out}$, by the interpolation as described here, is then obtained ($x_{Out}$).

Thus, the value of the sample interpolated at the instant x (relative to the central cubic therefore x in [0, 1]) is obtained by the weighted sum of these 3 values:
Vc3=pp*vcp(x)+pc*vcc(x)+ps*vcs(x) where, in an exemplary embodiment, the weighting coefficient pp, pc and ps are in the interval [0, 1], with pp+pc+ps=1 and, generally, pp=ps=(1−pc)/2.

For example, pp=pc=ps=⅓ can be chosen. In this case, the division by 3 can be integrated in the coefficients of the cubics.

It will be noted that the invention illustrated in FIG. 7 does not take account of the samples at the edge of the input buffer $x_{In}(n)$, n=0, . . . , L−1. As explained later in the invention:

It is assumed that the samples at the start of the output buffer (between the two first samples $x_{In}(n)$, n=0,1) can be interpolated by knowing the values of the past signal at the preceding instants n=−1,−2 which are necessary to determine the first coefficients $a_{-1}$, $b_{-1}$, $c_{-1}$, $d_{-1}$, $a_0$, $b_0$, $c_0$ and $d_0$; these past samples can be incorporated in the input buffer or used separately in the implementation of the block E701.

The samples at the end of the output buffer (between and after the two last samples, $x_{In}(n)$, n=L−2,L−1) cannot be directly interpolated according to the blocks E701 and E702 because there is in general no future signal available, corresponding to the instants n=L, L+1, which are necessary to determine the last coefficients $a_{L-11}$, $b_{L-1}$, $c_{L-1}$, $d_{L-1}$, $a_L$, $b_L$, $c_L$ and $d_L$. Different variants for processing the samples at the edges are described later.

Figure 6:
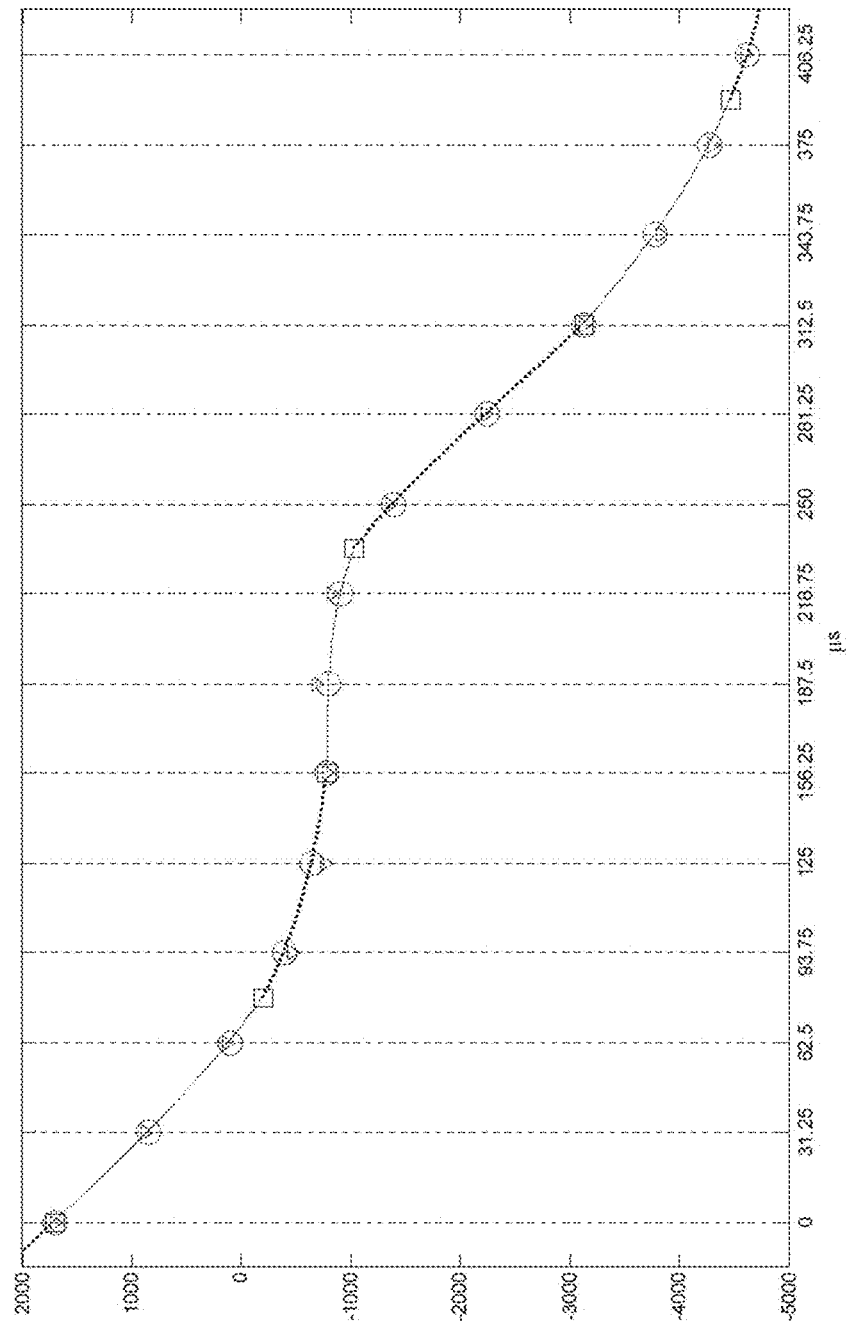
FIG. 6, as previously described, illustrates a comparison between the samples obtained by an interpolation of FIR type and by an interpolation of cubic type from the prior art.
Figure 12:
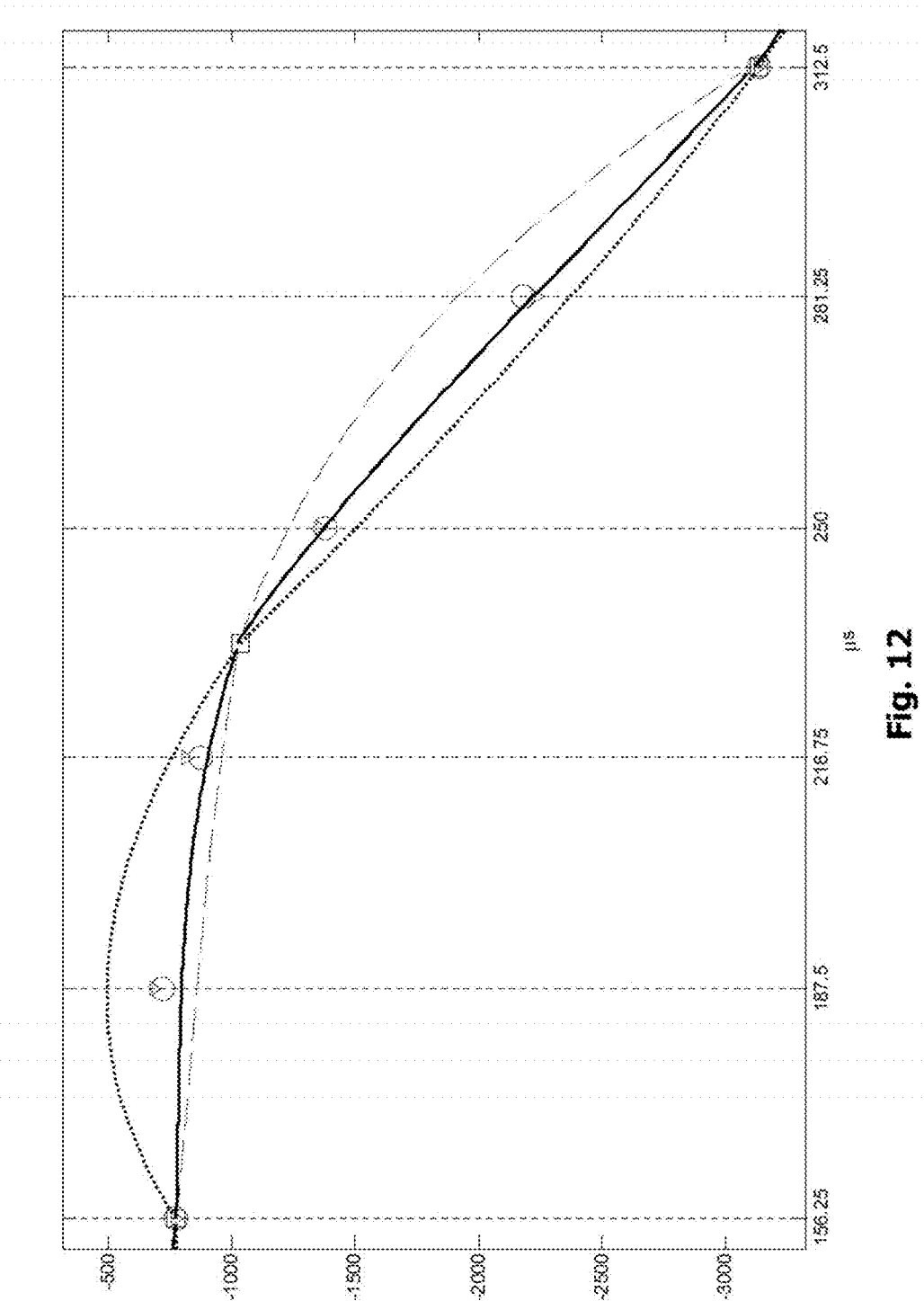
FIG. 12 illustrates a comparison between the samples obtained by an interpolation of FIR type, by an interpolation of cubic type from the prior art and by an interpolation according to an embodiment of the invention.

The samples thus interpolated with pp=pc=ps=⅓ are illustrated in FIG. 12 by round markers. It can be noted that these interpolated samples are closer to the reference signal than were the samples interpolated by simple cubic interpolation (see intersection of the continuous line and the vertical dotted lines) obtained with the central interval illustrated in FIG. 6.

Figure 1:
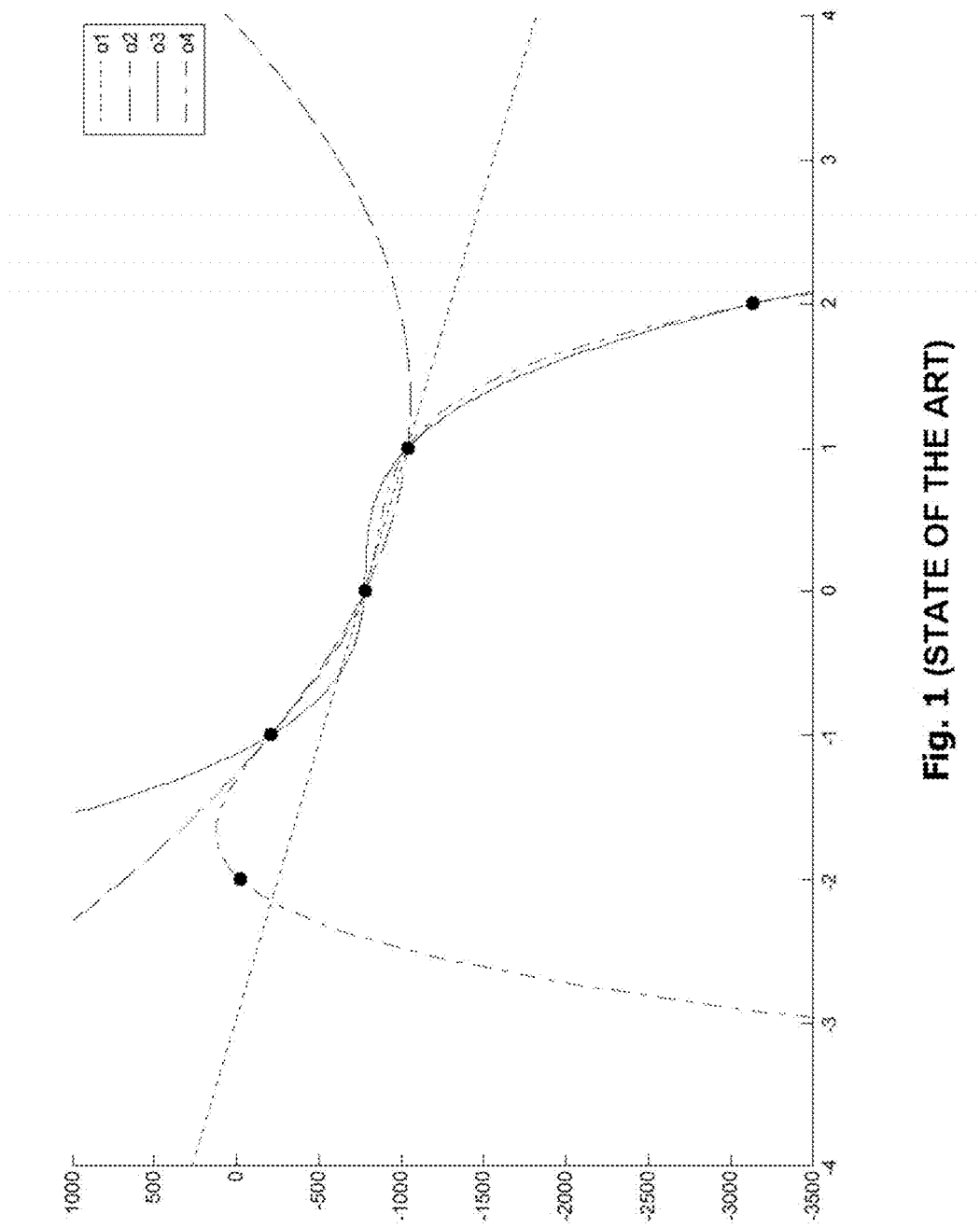
FIG. 1, as described previously, illustrates a comparison between different types of interpolation from the prior art by a representation of polynomial curves defined by predefined points at the instants represented on the x axis.
Figure 2:
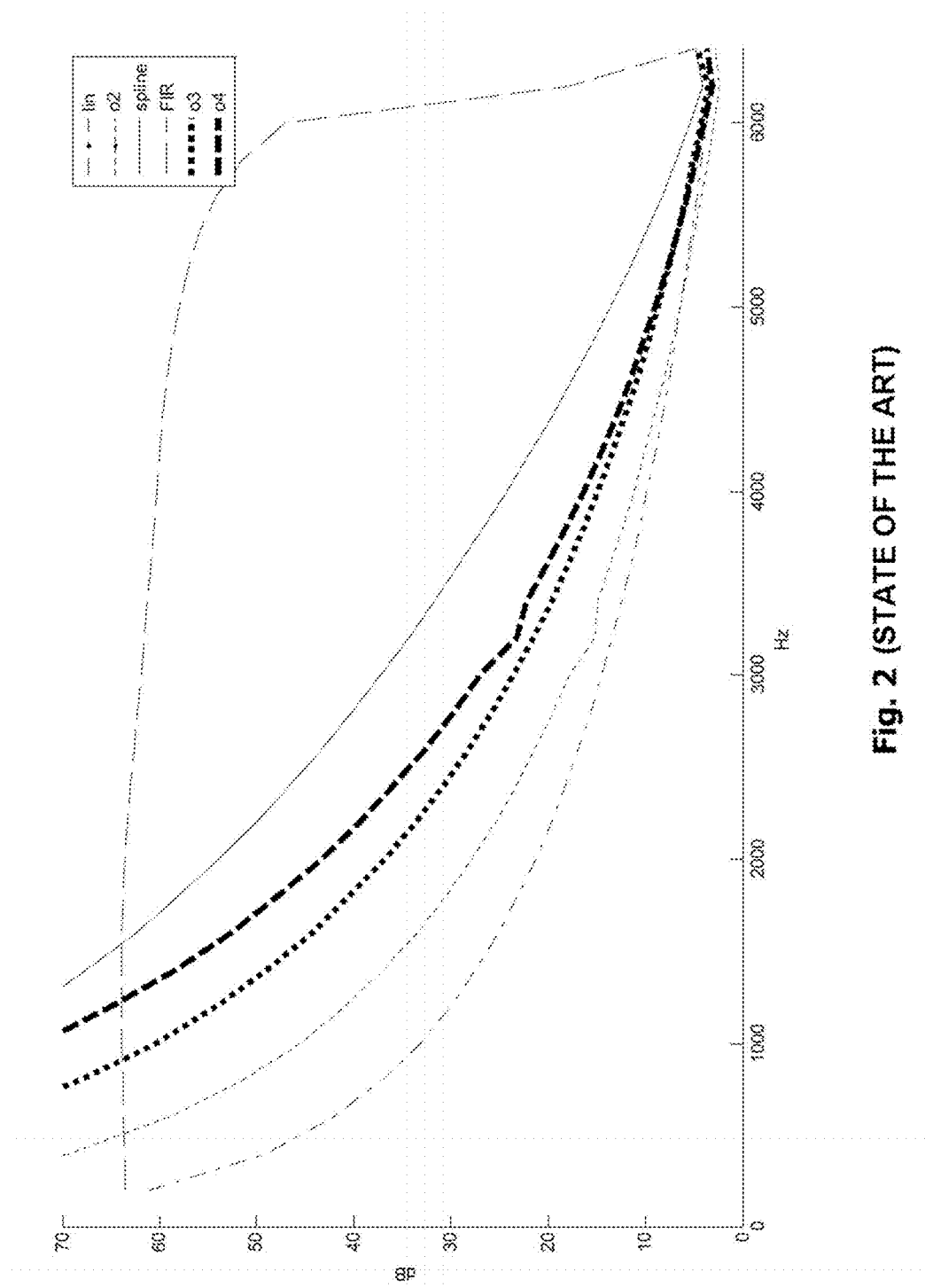
FIG. 2, as previously described, illustrates the result of the signal-to-noise ratio as a function of the frequency for different types of interpolation of the prior art.
Figure 3:
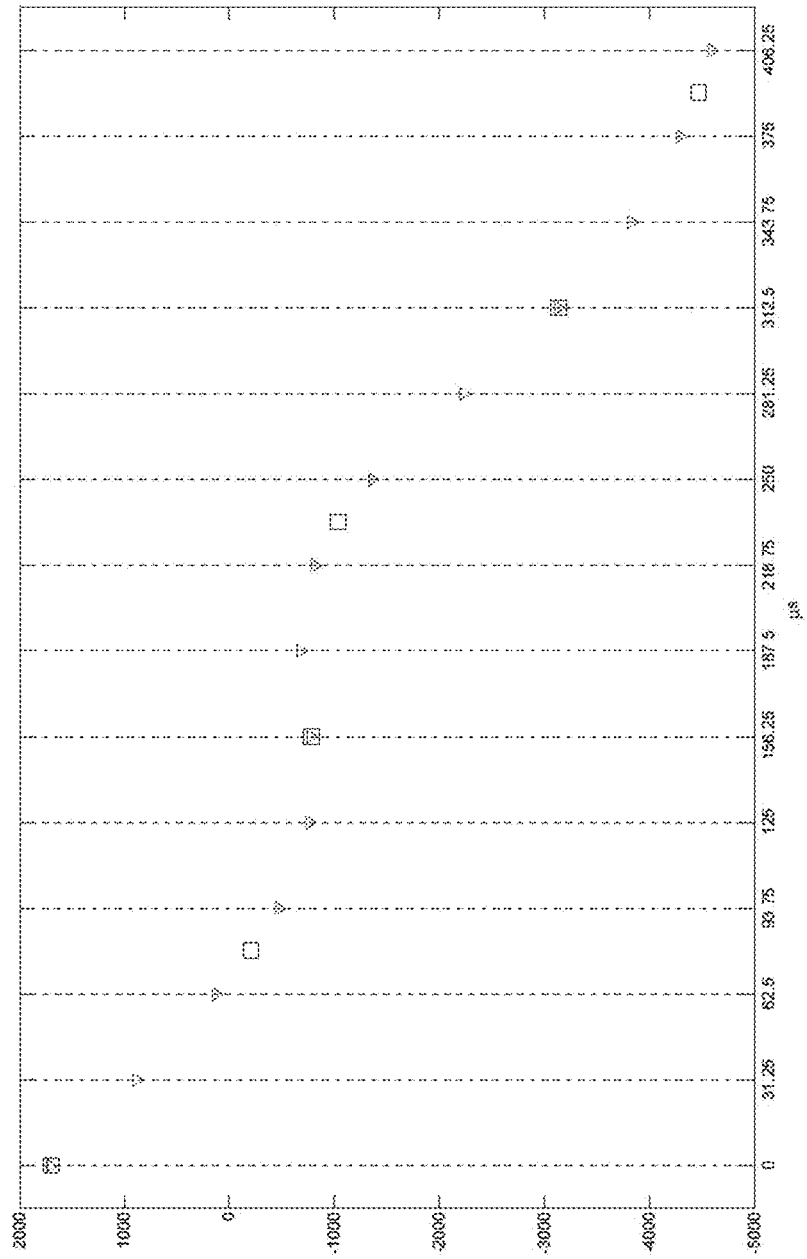
FIG. 3, as previously described, illustrates an interpolation for a resampling from 12 800 Hz to 32 000 Hz performed by a filter of FIR type.
Figure 4:
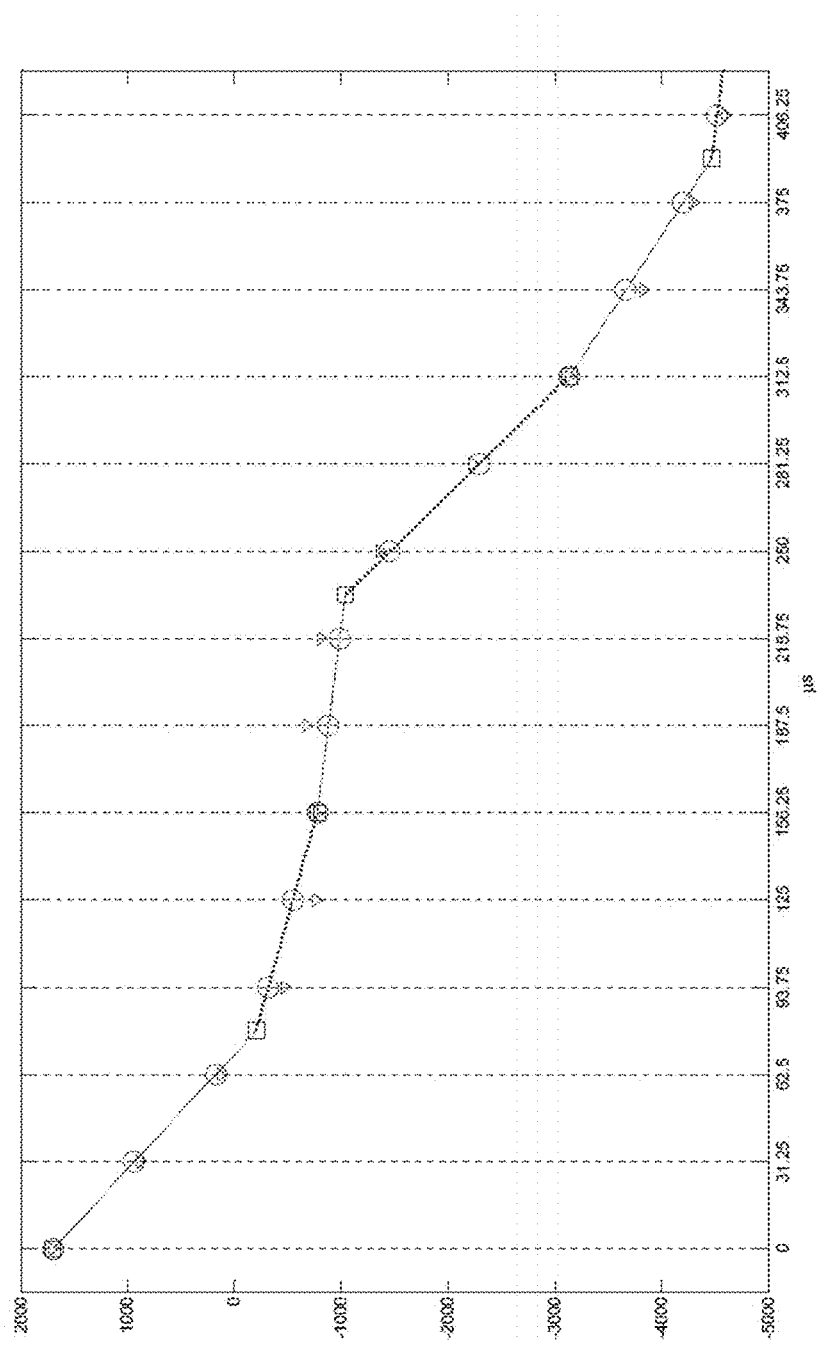
FIG. 4, as previously described, illustrates a comparison between the samples obtained by an interpolation of FIR type and by an interpolation of linear type from the prior art.
Figure 5:
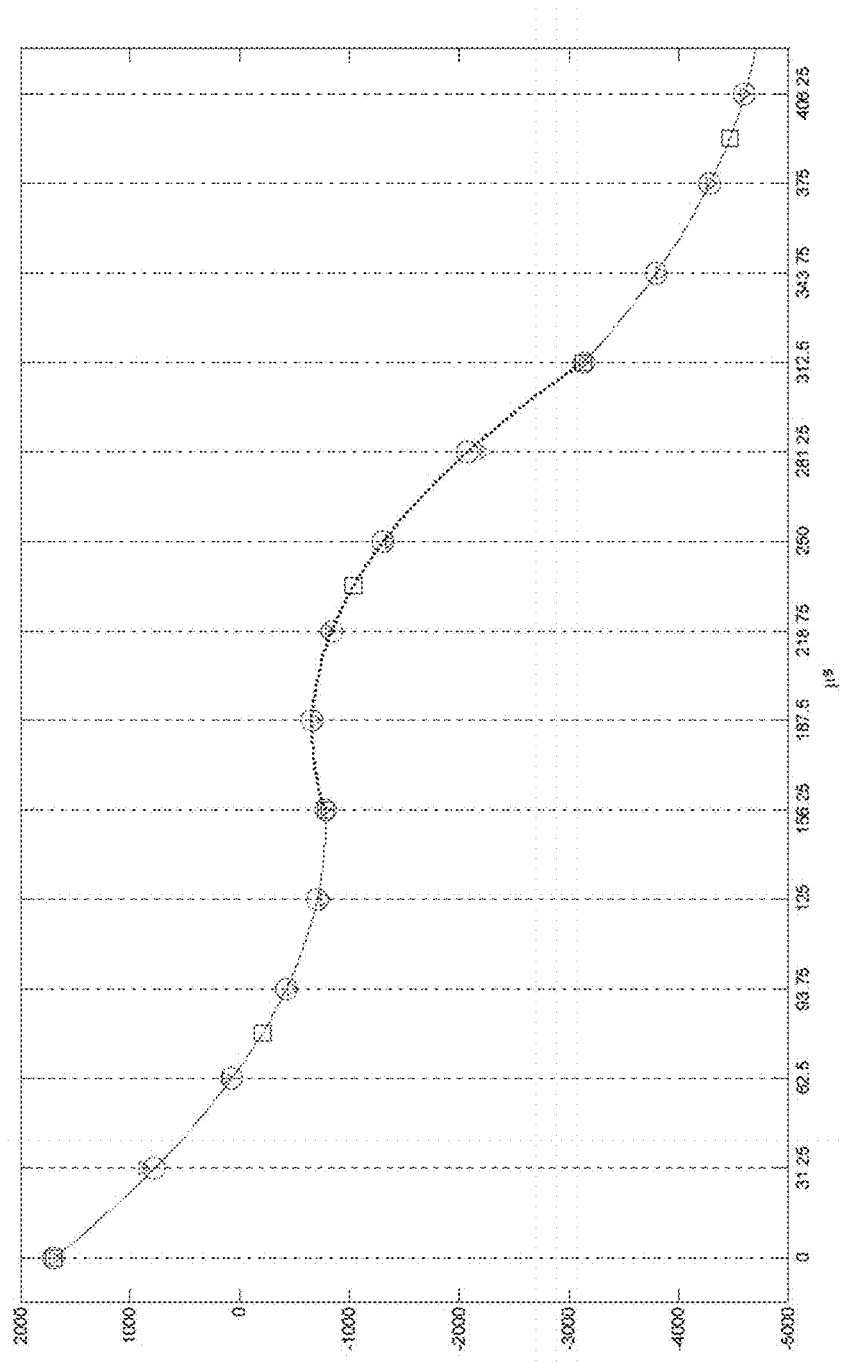
FIG. 5, as previously described, illustrates a comparison between the samples obtained by an interpolation of FIR type and by an interpolation of parabolic type from the prior art.
Figure 13:
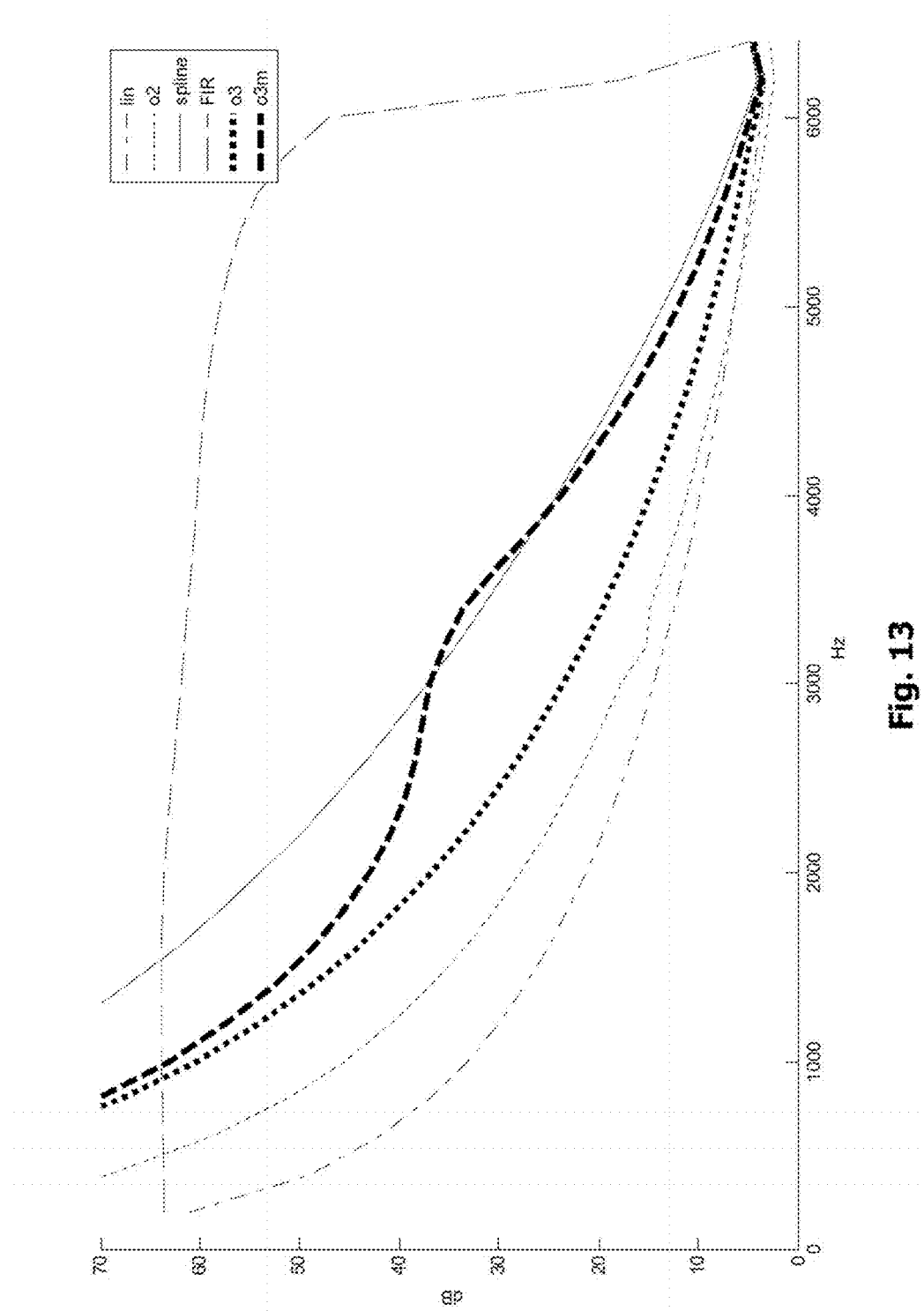
FIG. 13 illustrates the result of the signal-to-noise ratio as a function of the frequency for different types of interpolation from the prior art and for the interpolation according to a first embodiment of the invention.

FIG. 13 re-uses the elements of FIG. 2 and is complemented by the curve ("o3m") corresponding to the interpolation as described by the method of FIG. 7 according to the invention. It can be seen that the proposed interpolation has a still higher performance level than the simple cubic interpolation, above all in the frequency zones where the SNR of the simple interpolation becomes critical, above 2500 Hz. This increase in SNR reaches even 14 dB around the frequency of 3400 Hz. With the interpolation method according to the invention, the limit of 30 dB is at 3600 Hz which is even better than that of the interpolation by cubic "spline". The complexity of the interpolation proposed for the case of the example used of the resampling from 12 800 Hz to 32 000 Hz is 60 operations per group of 2 input samples, i.e. 384 000 operations per second.

With the solution according to the invention, the SNR for the speech signal is 40 dB. To recap, the SNRs obtained were 38.2 dB with the cubic interpolation known from the prior art and 41.4 dB with the interpolation by cubic "spline". It can be seen that the proposed interpolation gives a better SNR compared to the Lagrange polynomial interpolations.

Figure 14:
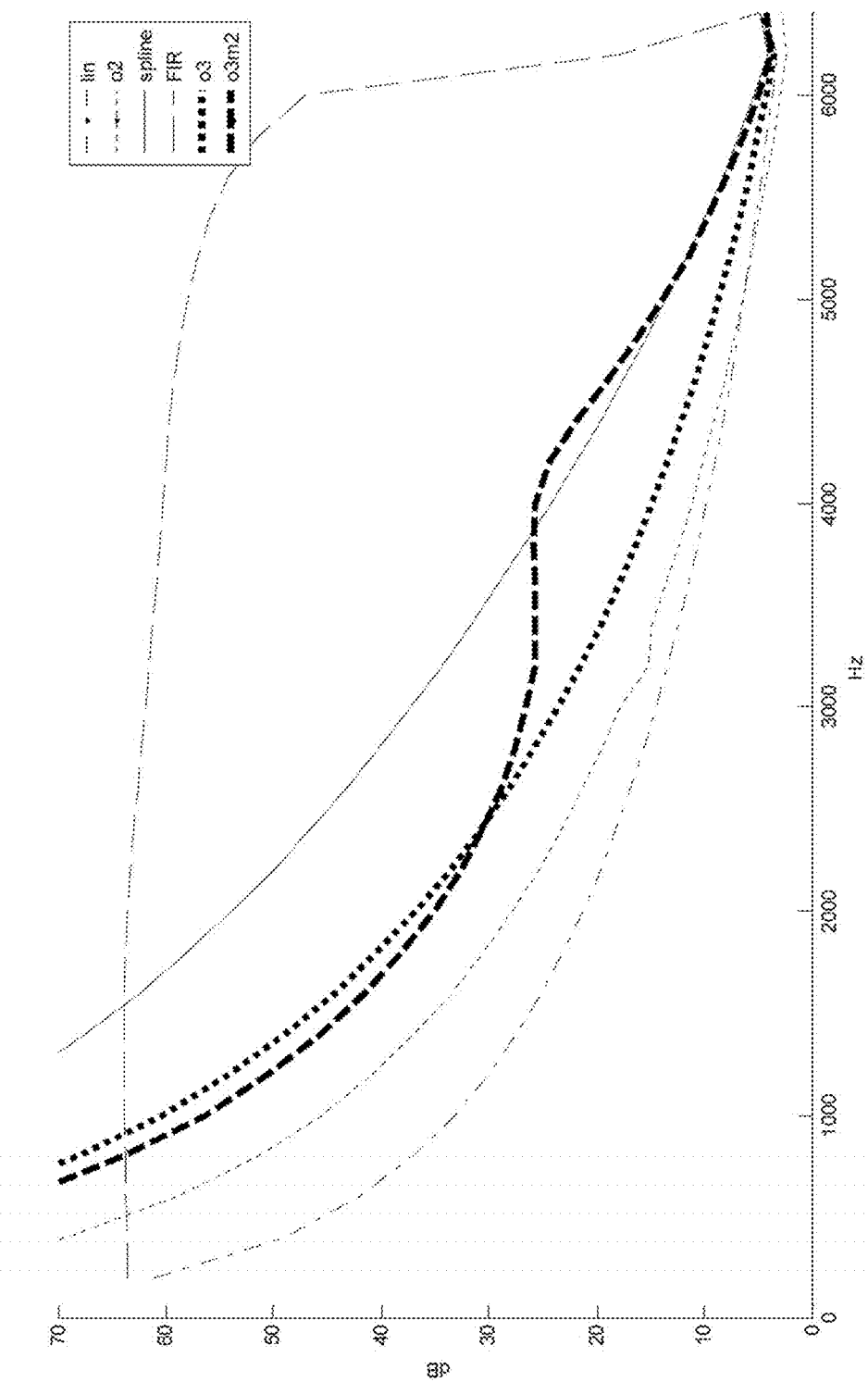
FIG. 14 illustrates the result of the signal-to-noise ratio as a function of the frequency for different types of interpolation from the prior art and for the interpolation according to a second embodiment of the invention.

In a variant of the invention, the weights (pp, pc, ps) are set at other predetermined values. In another exemplary embodiment, pp=ps=0.5 and pc=0 are chosen, which amounts to using the average of the interpolated values from the 2 extreme intervals. This reduces the number of operations to 47 (i.e. 300 800 operations per second) while having a significantly higher performance level than the simple cubic (Lagrange) interpolation. The SNR obtained for the real test signal is 40.4 dB. This solution has performance levels which are less good for the low frequencies but better for the high frequencies than the solution with three identical weights, as FIG. 14 shows (curve "o3m2").

In another variant of the invention, it will also be possible to use weights (pp, pc, ps) that are variable according to a criterion. For example, if the signal to be interpolated contains mostly low frequencies, the first solution proposed (pp=pc=ps=⅓) will be used, otherwise the second (pp=ps=0.5 and pc=0) will be used.

The principle of the invention can be generalized for the interpolations of order other than 3. For example, in the case of a parabolic interpolation, it is possible to take the average of the 2 values given by the 2 possible parabolas.

In this case, the interpolated samples are obtained by a computation of a weighted average of possible interpolation values computed over two intervals of values covering the temporal location of the sample to be interpolated.

This solution gives a result that is virtually equivalent to the simple cubic interpolation where only the central interval is used.

Figure 8:
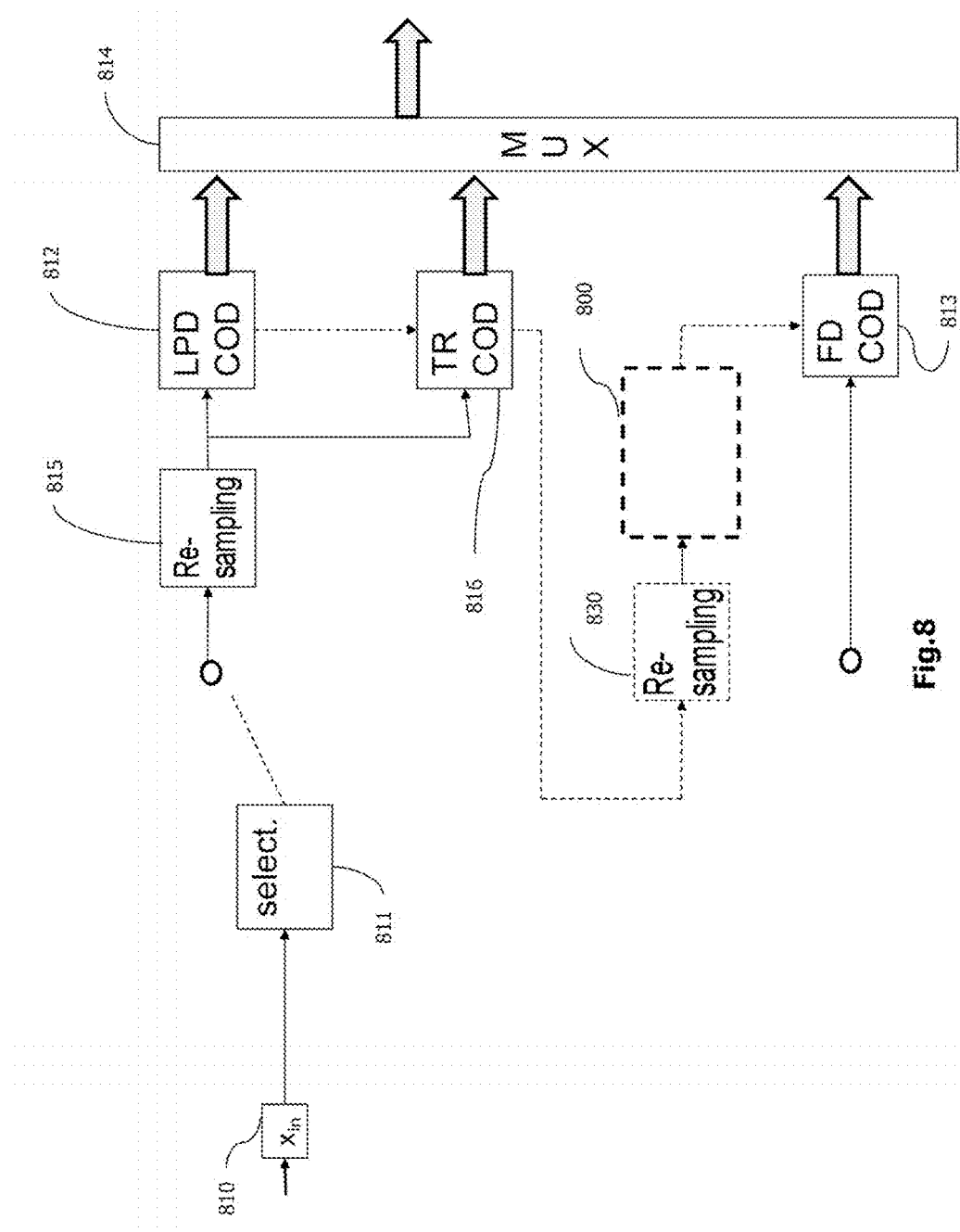
FIG. 8 illustrates an example of an audio signal coder comprising a resampling device according to an embodiment of the invention.

FIG. 8 illustrates an example of an audio coder comprising, in a local decoder, a resampling device according to an embodiment of the invention.

In this embodiment, interest is focused on the unified coding of the speech, music and mixed content signals, through multi-mode techniques alternating at least two coding modes, and of which the algorithmic delay is suited to the conversational applications (typically 32 ms).

Among these unified coding techniques, it is possible to cite prior art coders/decoders (codecs), like the AMR-WB+ codec or, more recently, the MPEG USAC ("Unified Speech Audio Coding") codec. The applications targeted by these codecs are not conversational, but correspond to broadcast and storage services, with no strong constraints on the algorithmic delay. The principle of the unified coding is to alternate between at least two coding modes:

for the signals of speech type: temporal mode, here denoted LPD (for linear predictive domain) generally of CELP (coded excitation linear prediction) type for the signals of music type: frequency mode, here denoted FD (for frequency domain) with a transform generally of MDCT (modified discrete cosine transform) type.

The principles of the CELP and MDCT codings are summarized below.

Firstly, the CELP coding—including its ACELP variant—is a predictive coding based on the source-filtered model. The filter corresponds in general to an all-pole filter of transfer function $1/A(z)$ obtained by linear prediction (LPC, linear predictive coding). In practice, the synthesis uses the quantized version, $1/\hat{A}(z)$, of the filter $1/A(z)$. The source—that is to say the excitation of the linear predictive filter $1/\hat{A}(z)$—is, in general, the combination of an excitation obtained by long-term prediction modeling the vibration of the vocal cords, and of a stochastic (or innovation) excitation described in the form of algebraic codes (ACELP), of noise dictionaries, etc. The search for "optimal" excitation is performed by the minimizing of a square error criterion in the weighted signal domain by a filter of transfer function $W(z)$, generally derived from the predictive linear filter $A(z)$, of the form $W(z)=A(z/\gamma 2)/A(z/\gamma 2)$ or $A(z/\gamma 1)/(1\alpha z^1)$. Secondly, the coding by MDCT transform analyzes the input signal with a time/frequency transformation generally comprising different steps:

1. weighting of the signal by a window here called "MDCT window"
2. temporal aliasing (or time-domain aliasing) to form a reduced block (in its conventional formula of length divided by 2)
3. DCT (discrete cosine transform) transformation of the reduced block.

The MDCT windowing can be adapted and the MDCT coefficients can be quantized by various methods according to an allocation of the bits (for example by frequency subbands).

In the codecs using at least two coding modes, the transitions between LDP and FD modes are crucial to ensure a sufficient quality without switching defect, knowing that the FD and LPD modes are of different natures—one relying on a coding by transform with overlap, whereas the other uses a linear predictive coding with rectangular blocks and filter memories updated on each frame.

For the coder illustrated in FIG. 8, the resampling method described with reference to FIG. 7 is implemented in the resampling device of a local decoder (optional) to perform the polynomial interpolation according to the invention so as to improve the quality of the switching in the case of a transition from an LPD mode to an FD mode. The associated decoder and the block 800 being described later with reference to FIG. 10.

In this embodiment illustrated in FIG. 8, the case of a coding of an input signal sampled at the frequency fs=16, 32 or 48 kHz (block 810) which works by 20 ms frames, is considered. This coder processes (mono) audio signals and offers several bit rates (for example set bit rates from 7.2 to 128 kbit/s). The coder uses at least two coding modes selected by the selection module 811, including an LPD mode (coding unit 812) having two internal sampling frequencies set at 12.8 and 16 kHz (according to the bit rate) which require the use of a sampling of the input frequency fs at the internal frequency of 12.8 or 16 kHz (block 815)

an FD mode (coding unit 813) operating at the frequency of the input signal fs.

The bit stream for each 20 ms input frame is multiplexed by the multiplexing module 814.

The case of a transition from an LPD coding to FD coding is described for example in the published European patent application EP 2656343 incorporated here for reference. In this case, as illustrated in FIG. 9a where fs=16 kHz, the signal not having been coded by the FD mode in the preceding frame (frame coded according to the CELP mode), the MDCT coding memory is not available for the current frame to be decoded. At the decoder (local or remote), it is necessary to generate a complementary signal for the shaded zone "TR" at the start of the current frame of FD type. This complementary signal is necessary to be able to make a "join" between the signals decoded by the successive LPD and FD modes; this complementary signal therefore fills a "gap". It will be noted that the complementary signal must be long enough to allow a cross-fade in order to limit the defects of transition from one mode to the other.

Here, the same principle is again applied of propagation of the signal by performing a simplified restricted LPD coding as described in the application EP 2656343 to fill this missing signal (zone denoted TR) in the transition frame of FD type which follows an LPD frame; it will be noted that the MDCT window illustrated here will be able to be modified in variants of the invention without changing the principle of the invention; in particular, the MDCT window in the transition frame will be able to be different from the MDCT window(s) used "normally" in the FD coding mode when the current frame is not an LDP to FD transition frame.

Figure 9B:
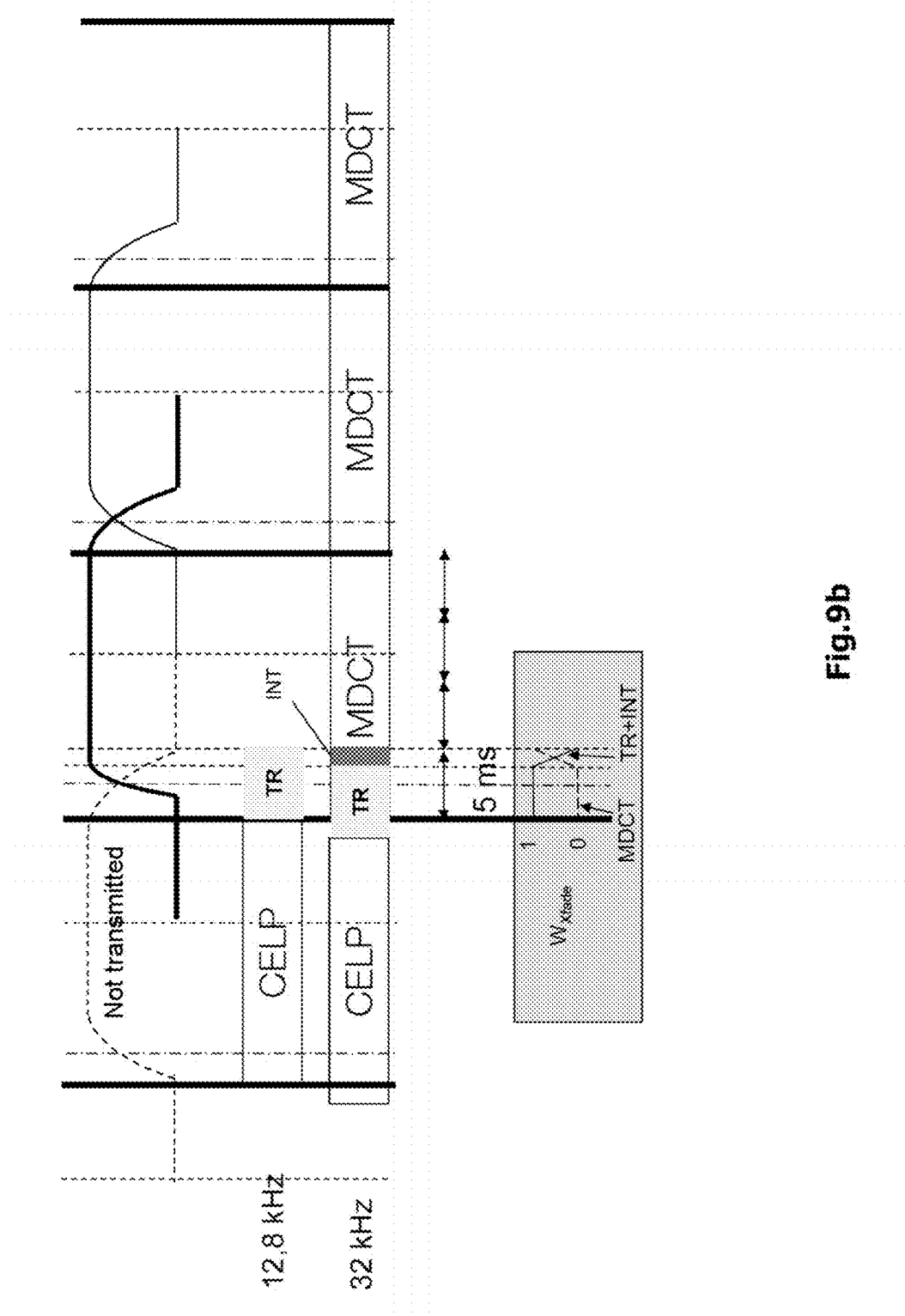
FIG. 9b illustrates a transition between a signal frame coded with a predictive coding and a frame coded by transform using a resampling method according to an embodiment of the invention.

However, in the coder illustrated in FIG. 8, the signal at the input and at the output of the restricted LPD coding/decoding (block 816) is at the frequency 12.8 or 16 kHz (depending on the bit rate); in case of local decoding, the signal decoded at 12.8 or 16 kHz must generally be resampled at the frequency fs before combining it (by cross-fade) with the signal at the output of the FD type coding/decoding (block 813) in the transition frame, the principle of this cross-fade being described in the patent application EP 2656343. FIG. 9b illustrates such a case, where the frequency of the LPD coder is 12 800 Hz and fs=32 000 Hz. The same principle applies when the frequency of the LPD coder is 16 000 Hz.

It is assumed here that the resampling from 12.8 or 16 kHz at fs of the resampling block 830 is performed by polyphase FIR filtering with a filter memory (called mem). This memory stores the last samples of the preceding frame of the signal decoded by LPD or TR mode at the frequency 12.8 or 16 kHz. The length of this memory corresponds to the FIR filtering delay. Because of this resampling delay, the signal at the frequency fs, here 32 kHz (derived from the resampling), is delayed. This resampling is problematic because it "enlarges" the gap to be filled between the LPD and FD modes in the transition frame. It therefore lacks samples to correctly implement the cross-fade between the LPD signal resampled at the frequency fs and the FD decoded signal. The last input samples at 12 800 or 16 000 Hz are, however, stored in the resampling step of the block 830. These stored samples correspond temporally to the missing samples at 32 kHz (dark gray zone in FIG. 9*b*, marked "INT") linked to the FIR filtering delay.

The interpolation according to the invention is used in this embodiment to resample the signal contained in the memory of the resampling filter (mem) in order to prolong the signal derived from the simplified LPD coding (block 816) at the start of the transition frame and thus obtain, at 32 kHz, the missing samples to be able to make the cross-fade between the LPD synthesis and the FD synthesis.

Figure 10:
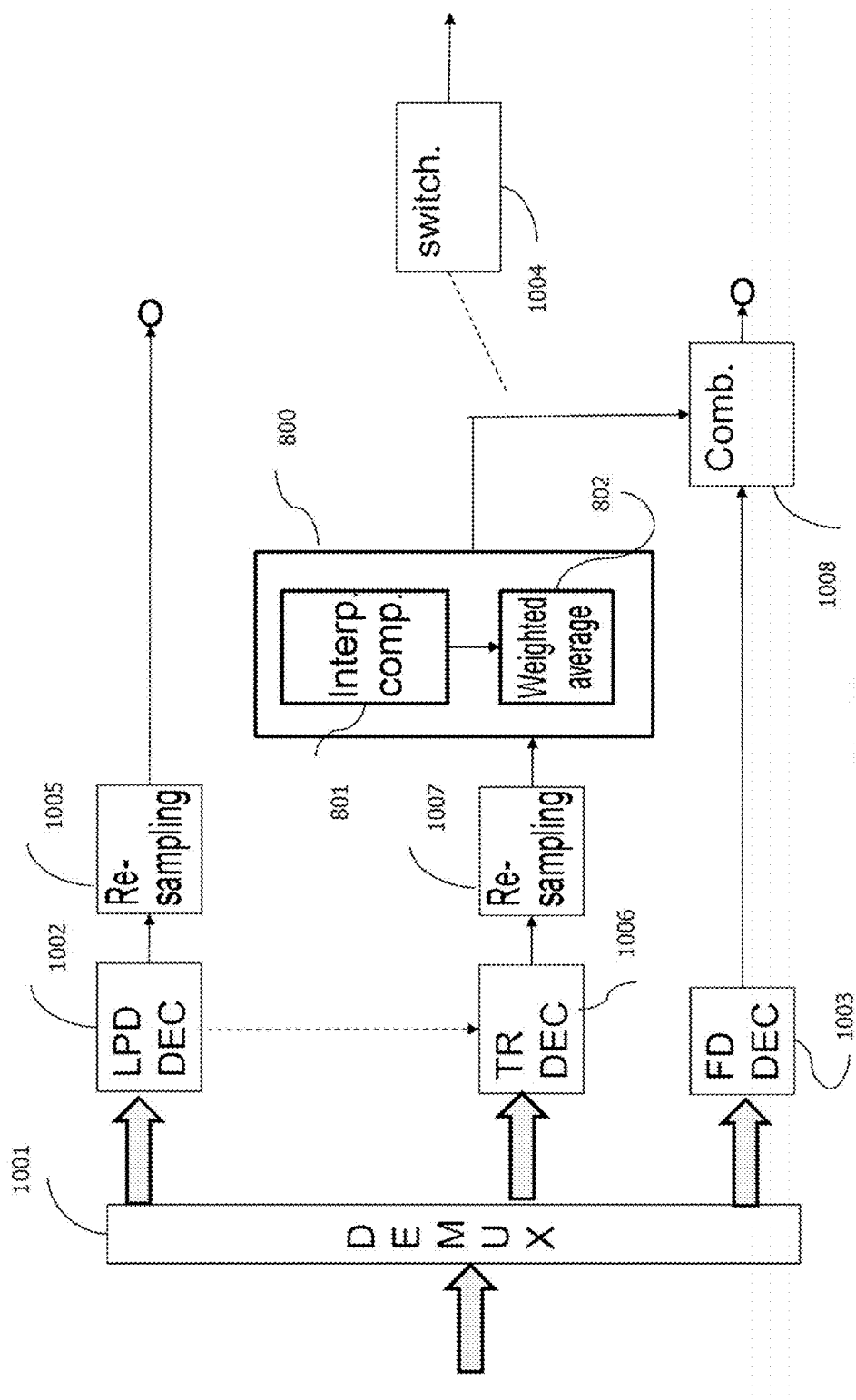
FIG. 10 illustrates an example of an audio signal decoder comprising a resampling device according to an embodiment of the invention.

The decoder illustrated in FIG. 10 is a (mono) audio signal multi-bit rate (with bit rates set from 7.2 to 128 kbit/s) decoder operating at the output sampling frequencies fs of 16, 32 or 48 kHz.

Depending on the frame received and demultiplexed (block 1001), the output is switched (1004) between the output of a temporal decoder (LPD DEC) of CELP type (1002) using a linear prediction and a frequency decoder (FD DEC, 1003). It will be noted that the output of the LPD decoder is resampled from the internal frequency 12.8 or 16 kHz to the output frequency fs by a resampling module 1005, for example of FIR type.

Here, the same principle is applied again of prolonging the signal by performing a simplified restricted LPD decoding (block 1006) as described in the application EP 2656343 to fill this missing signal (zone denoted TR) in the transition frame of FD type which follows an LPD frame.

In the decoder illustrated here in FIG. 10, the signal at the input and at the output of the restricted LPD decoding (block 1006) is at the frequency 12.8 or 16 kHz (depending on the bit rate) and it must generally be resampled at the frequency fs (by the resampling block 1007) before combining it (by cross-fade) by the module 1008 with the signal at the output of the decoding of FD type (block 1003) in the transition frame according to the principle described in the patent application EP 2656343. FIG. 9*b* illustrates such a case, where the frequency of the LPD coder is 12 800 Hz and fs=32 000 Hz with no loss of generality.

It is assumed here that the resampling from 12.8 or 16 kHz to fs of the resampling block 1007 is performed by polyphase FIR filtering with a filter memory (called mem). This memory stores the last samples of the preceding frame of the signal decoded by LPD or TR mode at the frequency 12.8 or 16 kHz. The length of this memory corresponds to the FIR filtering delay. Because of this resampling delay, the signal at the frequency fs, here 32 kHz (derived from the resampling) is delayed. This resampling is problematic because it "enlarges" the gap to be filled between the LPD and FD modes in the transition frame. It therefore samples lacks correctly implement to the cross-fade between the LPD signal resampled at the frequency fs and the FD decoded signal. The last input samples at 12 800 or 16 000 Hz are, however, stored in the resampling step of the block 1007. These stored samples correspond temporally to the missing samples at 32 kHz (dark gray zone in FIG. 9*b*, marked "INT") linked to the FIR filtering delay.

The interpolation according to the invention is used in this embodiment to resample the signal contained in the memory of the resampling filter (mem) in order to prolong the signal derived from the simplified restricted LPD decoding (block 1006) at the start of the transition frame and thus obtain, at 32 kHz, the missing samples to be able to make the cross-fade between the LPD synthesis and the FD synthesis.

To resample the signal (mem) contained in the memory of the resampling filter 1007, the resampling device 800 according to the invention performs an interpolation of order higher than one and comprises a module 801 for computing possible interpolation values for a plurality of intervals covering the temporal location of the sample to be interpolated. These possible interpolation values are computed, for example, as described with reference to FIG. 7 for a $3^{rd}$ order interpolation.

The resampling device also comprises a module 802 for obtaining samples to be interpolated by computation of a weighted average of the possible interpolation values derived from the computation module 801.

The duly resampled signal can be combined in 1008 with the signal derived from the FD coding of the module 1003 via a cross-fade as described in the patent application EP 2656343.

Figure 11:
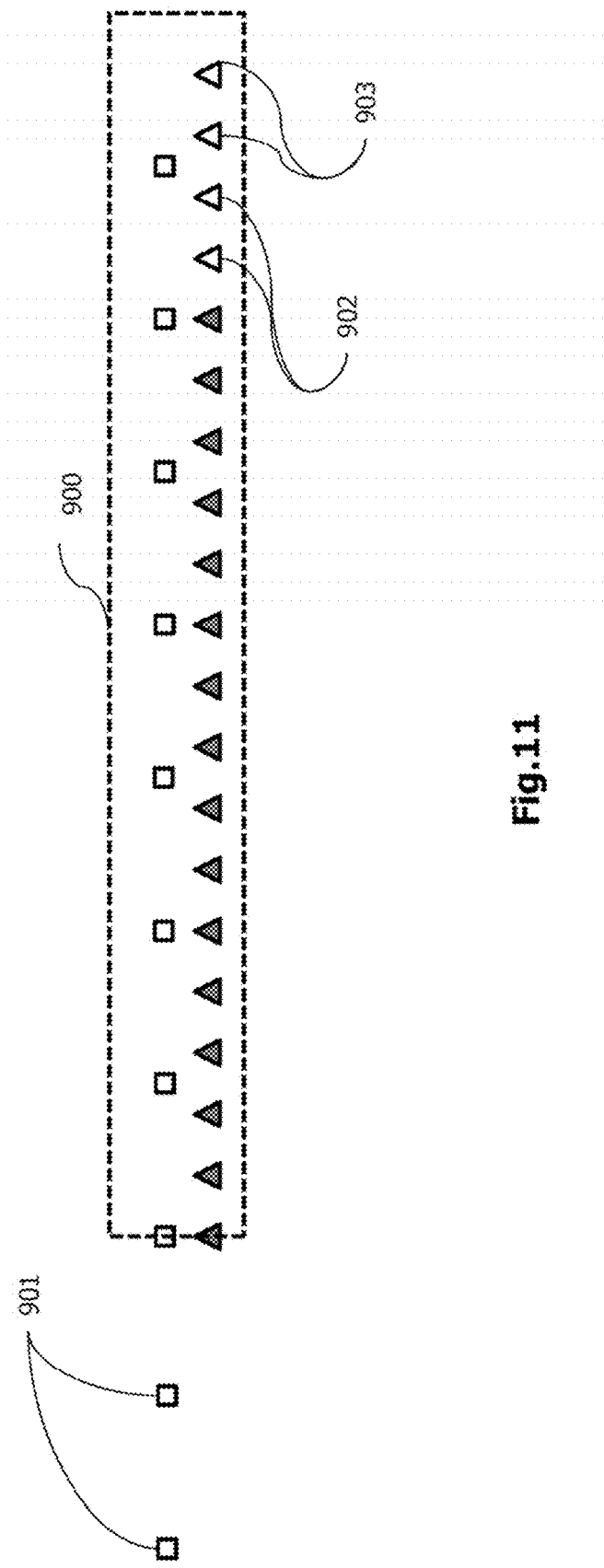
FIG. 11 illustrates an example of processing of the samples at the edges of the interval to be interpolated.

It must also be noted that, with the interpolation proposed according to the invention, it is not possible to cover the entire time domain of the filter memory (mem), as is illustrated in FIG. 11. In this figure, to simplify the illustration, a filter memory of 8 samples at 12 800 kHz symbolized by the square symbols is assumed. The typical length of such a memory is 12 samples at 12 800 Hz or 15 samples at 16 000 Hz. In FIG. 11, the time domain of the memory is delimited by the discontinuous line rectangle 900. The output samples at 32 000 Hz are symbolized by the triangles, over the given time domain there are 8*5/2=20 triangles. It is also assumed that the 2 past input samples are also available (squares 901 in the figure), which is the case here because they correspond to the signal decoded in the transition zone TR (simplified LPD coding). Thus, 16 output samples (solid triangles in the figure) out of a possible 20 can be interpolated according to the method of the invention. The next two output samples (triangles 902) can be interpolated by using the extreme right interval, or according to a parabolic interpolation on the last 3 input samples, or by linear interpolation on the last 2 input samples. The last two output samples of the time domain (triangles 903) must be extrapolated, either by using the prolonging of the last cubic, parabola or straight line, or by repeating the value of the last sample interpolated at 32 kHz or the value of the last input sample at 12.8 kHz.

In the preferred embodiment, the extreme right interval of the last cubic is used for the interpolation between the last 2 input samples (empty black triangles) and the last interpolated sample is repeated for the extrapolated samples (triangles 903).

Figure 15:
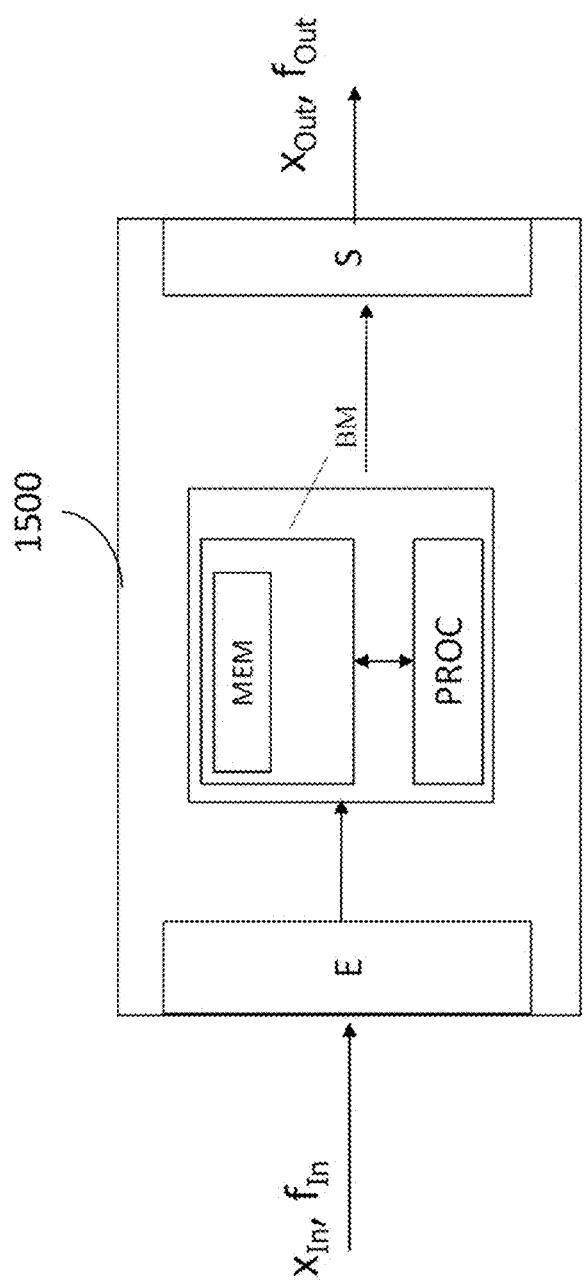
FIG. 15 illustrates a hardware representation of a resampling device according to an embodiment of the invention.

FIG. 15 represents an exemplary hardware implementation of a resampling device 1500 according to the invention. The latter can be an integral part of an audio frequency signal coder or decoder, or of an equipment item receiving audio frequency signals.

This type of device comprises a processor PROC cooperating with a memory block BM comprising a storage and/or working memory MEM.

Such a device comprises an input module E capable of receiving audio signal frames $x_{In}$ at a sampling frequency $f_{In}$. These audio signal frames are, for example, a signal contained in a memory of a resampling filter.

It comprises an output module S capable of transmitting the resampled audio frequency signal $x_{Out}$ at the sampling frequency of $f_{Out}$.

The memory block can advantageously comprise a computer program comprising code instructions for implementing the steps of the resampling method within the meaning of the invention, when these instructions are executed by the processor PROC, and notably for obtaining samples interpolated by a computation of a weighted average of possible interpolation values, computed over a plurality of intervals covering the temporal location of the sample to be interpolated.

Typically, the description of FIG. 7 again covers the steps of an algorithm of such a computer program. The computer program can also be stored on a memory medium that can be read by a reader of the device or that can be downloaded into the memory space thereof.

The memory MEM stores, generally, all the data necessary for the implementation of the method.

Although the present disclosure has been described with reference to one or more examples, workers skilled in the art will recognize that changes may be made in form and detail without departing from the scope of the disclosure and/or the appended claims.

The invention claimed is:

1. A method comprising:
receiving an audio frequency signal for resampling from a non-transitory computer-readable memory of a FIR type resampling filter; and
resampling the audio frequency signal by an audio frequency signal coder or decoder device, the resampling comprising performing an interpolation method of order higher than one, and obtaining interpolated samples by a computation of a weighted average of possible interpolation values computed over a plurality of intervals covering a temporal location of the sample to be interpolated, the interpolated samples complementing a signal decoded according to a restricted predictive decoding mode in a transition frame between a predictive decoding and a transform decoding prior to an act of combination between samples decoded according to the restricted predictive decoding and the samples decoded according to a transform decoding in the transition frame.

2. The method as claimed in claim 1, wherein the interpolation is of $2^{nd}$ order parabolic type.

3. The method as claimed in claim 1, wherein the interpolation is of $3^{rd}$ order cubic type and the number of intervals covering the temporal location of the sample to be interpolated is 3.

4. The method as claimed in claim 1, wherein the weighted average is obtained with one and the same weighting value for each of the possible interpolation values.

5. The method as claimed in claim 3, wherein a different weighting value is applied for the interpolation value computed for the central interval of the three intervals and for the computation of the weighted average.

6. The method as claimed in claim 1, wherein the weighting values applied to the possible interpolation values are determined as a function a frequency criterion of the sample to be interpolated.

7. A device for resampling an audio frequency signal in an audio frequency signal coder or decoder, wherein the device comprises:
a non-transitory computer-readable medium comprising instructions stored thereon;
a processor configured by the instructions to perform acts comprising:
receiving the audio frequency signal for resampling from a non-transitory computer-readable memory of a FIR type resampling filter;
and resampling the audio frequency signal by an interpolation method of order higher than one, comprising:
computing possible interpolation values for a plurality of intervals covering a temporal location of a sample to be interpolated; and
obtaining the sample to be interpolated by computing a weighted average of the possible interpolation values, the interpolated samples complementing a signal decoded according to a restricted predictive decoding mode in a transition frame between a predictive decoding and a transform decoding prior to an act of combination between samples decoded according to the restricted predictive decoding and the samples decoded according to a transform decoding in the transition frame.

8. The device of claim 7, wherein the device is implemented in an audio frequency signal coder.

9. The device of claim 7, wherein the device is implemented in an audio frequency signal decoder.

10. A non-transitory processor-readable storage medium, on which is stored a computer program comprising code instructions for executing a method when the instructions are executed by a processor of an audio frequency signal coder or decoder device, wherein the instructions configure the processor to perform acts comprising:
receiving an audio frequency signal for resampling from a non-transitory computer-readable memory of a FIR type resampling filter; and
resampling the audio frequency signal by an audio frequency signal coder or decoder device, the resampling comprising performing an interpolation method of order higher than one, and obtaining interpolated samples by a computation of a weighted average of possible interpolation values computed over a plurality of intervals covering a temporal location of the sample to be interpolated, the interpolated samples complementing a signal decoded according to a restricted predictive decoding mode in a transition frame between a predictive decoding and a transform decoding prior to an act of combination between samples decoded according to the restricted predictive decoding and the samples decoded according to a transform decoding in the transition frame.

11. The method as claimed in claim 1, further comprising:
transmitting a resampled audio frequency signal, comprising the interpolated samples, by the coder or decoder device at a sampling frequency.

12. The device as claimed in claim 7, further comprising:
an output module, which transmits a resampled audio frequency signal comprising the interpolated samples, at a sampling frequency.

* * * * *